United States Patent
Ito et al.

(10) Patent No.: US 7,046,569 B2
(45) Date of Patent: May 16, 2006

(54) SEMICONDUCTOR INTEGRATED CIRCUIT DEVICE INCLUDING OTP MEMORY, AND METHOD OF PROGRAMMING OTP MEMORY

(75) Inventors: Hiroshi Ito, Yokohama (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/898,249

(22) Filed: Jul. 26, 2004

(65) Prior Publication Data

US 2005/0226078 A1    Oct. 13, 2005

(30) Foreign Application Priority Data

Apr. 7, 2004    (JP) .............................. 2004-113440

(51) Int. Cl.
*G11C 7/00*    (2006.01)

(52) U.S. Cl. ............. 365/225; 365/230.03; 365/185.22

(58) Field of Classification Search ................ 365/225, 365/230.03, 185.22, 185.21, 96
See application file for complete search history.

(56) References Cited

U.S. PATENT DOCUMENTS

| 6,243,294 | B1 | 6/2001 | Rao et al. | |
|---|---|---|---|---|
| 6,549,458 | B1 | 4/2003 | Rao et al. | |
| 2003/0128576 | A1* | 7/2003 | Smith et al. | 365/154 |
| 2004/0004855 | A1* | 1/2004 | Kurth et al. | 365/149 |
| 2004/0037117 | A1* | 2/2004 | Low et al. | 365/185.21 |
| 2004/0125638 | A1* | 7/2004 | Lin et al. | 365/96 |
| 2005/0105366 | A1* | 5/2005 | Pedlow, Jr. | 365/225.7 |
| 2005/0226078 | A1 | 10/2005 | Ito et al. | |

FOREIGN PATENT DOCUMENTS

| JP | 2000-12699 | 1/2000 |
|---|---|---|
| JP | 2003-168734 | 6/2003 |

OTHER PUBLICATIONS

Jinbong Kim, et al., "Three-Transistor One-Time Programmable (OTP) ROM Cell Array Using Standard CMOS Gate Oxide Antifuse", IEEE Electron Device Letters, vol. 24, No. 9, Sep. 2003, pp. 589-591.
U.S. Appl. No. 11/231,983, filed Sep. 22, 2005, Nakano et al.
U.S. Appl. No. 11/231,795, filed Sep. 22, 2005, Nakayama et al.
U.S. Appl. No. 11/221,943, filed Sep. 9, 2005, Namekawa et al.

* cited by examiner

*Primary Examiner*—Richard Elms
*Assistant Examiner*—Dang T. Nguyen
(74) *Attorney, Agent, or Firm*—Oblon, Spivak, McClelland, Maier & Neustadt, P.C.

(57) ABSTRACT

A semiconductor integrated circuit device includes a storage element, state sensing circuit, and control circuit. Information is programmed in the storage element by electrically irreversibly changing the element characteristics. The state sensing circuit is configured to sense the irreversibly changed state of the storage element in distinction from an unchanged state. The control circuit is configured to change the sensibility of the state sensing circuit.

23 Claims, 8 Drawing Sheets

SEMICONDUCTOR INTEGRATED CIRCUIT DEVICE INCLUDING OTP MEMORY, AND METHOD OF PROGRAMMING OTP MEMORY

CROSS-REFERENCE TO RELATED APPLICATIONS

This application is based upon and claims the benefit of priority from prior Japanese Patent Application No. 2004-113440, filed Apr. 7, 2004, the entire contents of which are incorporated herein by reference.

BACKGROUND OF THE INVENTION

1. Field of the Invention

The present invention relates to a semiconductor integrated circuit device and a method of programming the same and, more particularly, to a semiconductor integrated circuit device including an electrically programmable irreversible storage element, i.e., a so-called OTP (One-Time Programmable) memory, and a method of programming information in this storage element.

2. Description of the Related Art

In the recent semiconductor integrated circuit devices, a nonvolatile OTP memory, in which stored information does not disappear even when the power supply is turned off, is an essential element. The OTP memory is widely used for the purposes of, e.g., redundancy of a large-capacity memory such as a DRAM or SRAM, tuning of an analog circuit, code storage of, e.g., an encryption key, and storage of management information such as the log in the fabrication process.

For the memory redundancy purpose, for example, a ROM using a laser fuse which irreversibly stores information by blow by emitting a laser beam is used as the most inexpensive nonvolatile memory.

This laser fuse ROM requires a special fuse blowing device and a blowing step using the device, and hence requires a test cost for the purpose. Also, the minimum dimension of the laser fuse is determined by the wavelength of the laser beam used. Therefore, micropatterning of the laser fuse does not keep pace with that of the rest of the circuit, so the ratio of the area occupied by the laser fuse is gradually increasing. In addition, a method of programming the laser fuse allows it to be programmed only in the form of a wafer. Accordingly, the laser fuse cannot be used in, e.g., remedy of defects in a high-speed test after packaging, or built-in self repair performed by a test circuit built in a chip. Therefore, an electrically programmable nonvolatile memory is desirably incorporated into a system which uses the laser fuse.

On the other hand, in a system made up of a plurality of chips, various pieces of information can be stored in independent EEPROM chips. However, an SoC (System on Chip) by which a system is integrated on a single chip must have a nonvolatile memory inside the system. Unfortunately, embedding a nonvolatile memory which stores electric charge in a floating gate requires additional masks and processes for the purpose, and this increases the cost.

Note that all pieces of information to be stored in a nonvolatile memory, such as the memory redundancy information as described above, need not be rewritten many times. Accordingly, an OTP memory which can be fabricated by the standard CMOS process meets a variety of demands. In this specification, storage elements which are used in an OTP memory and which store information by irreversibly changing the element characteristics will be generally referred to as fuse elements hereinafter. Also, of these fuse elements, those which electrically irreversibly change the element characteristics will be referred to as electrical fuses hereinafter.

Examples of the electrical fuses are a poly (or metal) electrical fuse which changes the resistance value by supplying a large electric current to a polysilicon or metal line which intentionally increases the current density, and an anti fuse which uses dielectric breakdown of an element forming an integrated circuit. A gate oxide breakdown type anti fuse which uses a gate oxide of a MOS transistor as an insulator to be broken down requires no special additional process, and hence is widely applicable to CMOS products (e.g., Jpn. Pat. Appln. KOKAI Publication Nos. 2000-012699 and 2003-168734).

Generally, an electrical fuse changes the state of a fuse element within a short time period by a large electric current or voltage stress. In the electrical fuse which thus uses a breakdown phenomenon as a program mechanism, programming is a stochastic process; some elements are programmed immediately after the application of stress, and some elements are not well programmed within a limited programming time.

Remedy of such an insufficiently programmed defective bit requires a verify step which reads out (senses) data from an electrical fuse after programming, and compares the programmed data with the readout data. Whether the data is "pass" or "fail" is determined by this verify. If the data is "fail", this imperfectly programmed bit must be reprogrammed.

The element characteristics after programming distribute with wide variations. Also, when deterioration of the element characteristics with time is taken into consideration, defective bits must be detected with a satisfactory margin. However, the conventional verify determines pass/fail by executing the same sense operation as a normal operation, and hence cannot detect a bit having marginal characteristics as a defect. This may cause a market defect.

BRIEF SUMMARY OF THE INVENTION

According to an aspect of the invention, there is provided a semiconductor integrated circuit device comprising a storage element in which information is programmed by electrically irreversibly changing an element characteristic, a state sensing circuit configured to sense the irreversibly changed state of the storage element in distinction from an unchanged state, and a control circuit configured to change sensibility of the state sensing circuit.

According to another aspect of the invention, there is provided a method of programming a semiconductor integrated circuit device in which information is read out from a storage element by sensing an irreversibly changed state of the storage element in distinction from an unchanged state during a normal read operation, comprising storing data to be programmed into a fuse data register, programming information in the storage element by electrically irreversibly changing an element characteristic, reading out information from the storage element by sensing the irreversibly changed state of the storage element in distinction from an unchanged state by making sensibility lower than that for a normal read operation, comparing the information in the fuse data register with the information read out from the storage element, and outputting a comparison result indicating pass/fail, individually specifying a bit whose comparison result indicates fail as a defective bit, and reprogramming the storage element on the basis of information of the specified defective bit.

DETAILED DESCRIPTION OF THE INVENTION

In an embodiment of the present invention, data corresponding to a programmed electrical fuse is "1", and data corresponding to an electrical fuse which is not programmed is "0". When verify is performed after an OTP memory using an electrical fuse is programmed, the margin of sensing data "1" in verify sense, in which data at the electrical fuse is read, is made smaller than that applied in a normal sense operation. Accordingly, even a bit having marginal characteristics can be sensed as a defective bit.

Data programmed at an electrical fuse is converted into a voltage at a level corresponding to the resistance of the electrical fuse. This voltage is compared with a reference voltage, and read out as "0" or "1". When a signal voltage is generated by charging or discharging of a capacitor via an electrical fuse, the signal amount of data "1" can be controlled by changing the charging or discharging time. It is also possible to change the signal amount of data "1" viewed from a sense amplifier by changing the reference voltage.

Accordingly, the sense margin of data "1" is made smaller by controlling one or both of the signal development time (SDT) of a signal voltage and the reference voltage (VREF).

Furthermore, a circuit for outputting one bit as a result of pass/fail to the outside and for reprogramming only a defective bit not matching with program data is formed inside a semiconductor integrated circuit device. This makes it possible to efficiently execute a series of operations of verify, pass/fail determination, and reprogramming.

A semiconductor integrated circuit device which efficiently executes the series of operations of verify, pass/fail determination, and reprogramming as described above, and a method of programming the device will be explained in more detail below in an embodiment shown in FIGS. 1 to 9.

Figure 1:
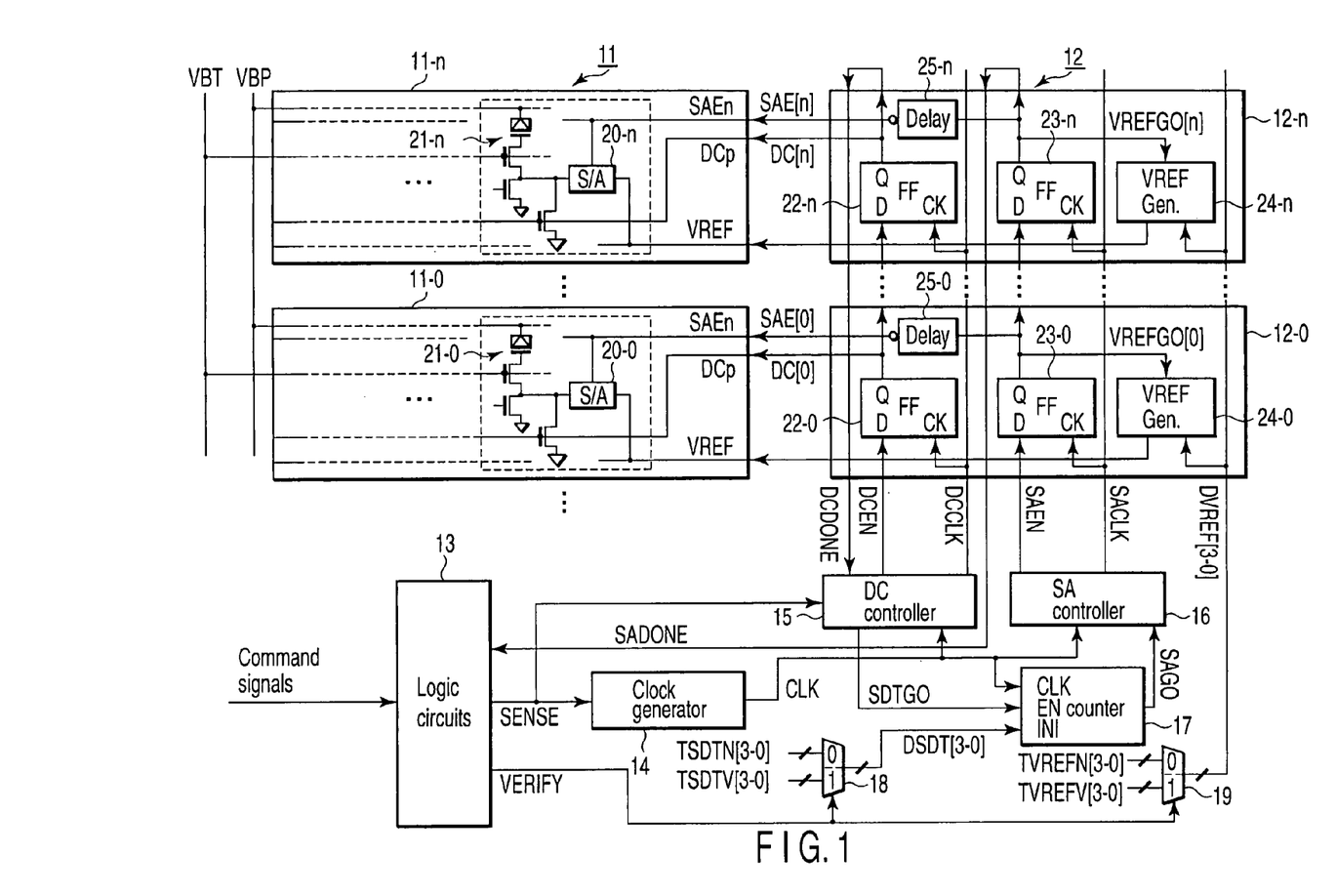
FIG. 1 is a block diagram showing an OTP memory and a peripheral circuit related to a program operation and sense operation of this OTP memory, in order to explain a semiconductor integrated circuit device according to an embodiment of the present invention.

FIG. 1 is a block diagram showing an OTP memory in a semiconductor integrated circuit device, and a peripheral circuit related to a program operation and sense operation of this OTP memory. This circuit includes a memory cell array 11, controller 12, logic circuits 13, clock generator 14, DC controller 15, sense amplifier controller (SA controller) 16, counter 17, multiplexers 18 and 19, and the like.

The memory cell array 11 is formed by stacking a plurality of (n+1) memory blocks 11-0, . . . , 11-n. The memory blocks 11-0, . . . , 11-n are formed by juxtaposing memory cells 21-0, . . . , 21-n each having an electrical fuse as a storage element in which information is programmed by electrically irreversibly changing the element characteristics, and sense amplifiers 20-0, . . . , 20-n which function as state sensors for sensing the irreversibly changed state of an electrical fuse in distinction from an unchanged state.

The controller 12 changes the sensibility, i.e., the ability to sense a programmed bit, of the sense amplifiers 20-0, . . . , 20-n. The controller 12 is made up of control blocks 12-0, . . . , 12-n corresponding to the memory blocks 11-0, . . . , 11-n. The control blocks 12-0, . . . , 12-n include flip-flops (FF) 22-0, . . . , 22-n for outputting reset signals DCp to the memory cells 21-0, . . . , 21-n in the memory blocks 11-0, . . . , 1'-n, flip-flops (FF) 23-0, . . . , 23-n for outputting enable signals SAEn to the sense amplifiers 20-0, . . . , 20-n in the memory blocks 11-0, . . . , 11-n, reference voltage generators (VREF Gen.) 24-0, . . . , 24-n for supplying reference voltages VREF to the sense amplifiers 20-0, . . . , 20-n, and delay circuits (delay) 25-0, . . . , 25-n.

The logic circuits (interface logic circuits) 13 receive various command signals from the outside. An output signal SENSE indicating a sense operation from the logic circuits 13 is supplied to the clock generator 14 and DC controller 15. Also, an output signal VERIFY indicating a verify operation from the logic circuits 13 is supplied to the multiplexers 18 and 19. A clock signal CLK generated by the clock generator 14 is supplied to the DC controller 15, SA controller 16, and counter 17.

An output signal DCEN from the DC controller 15 is supplied to a data input terminal D of the flip-flop 22-0 in the control block 12-0. An output clock signal DCCLK from the DC controller 15 is supplied to clock input terminals CK of the flip-flops 22-0, . . . , 22-n in the control blocks 12-0, . . . , 12-n. An output signal DC[0] from an output terminal Q of the flip-flop 22-0 is supplied to a data input terminal D of the flip-flop 22-1 in the next stage. Similarly, output signals DC[1] to DC[n−1] from output terminals Q of the flip-flops 22-1 to 22-(n−1) are supplied to data input terminals D of the flip-flops 22-2 to 22-n in the respective next stages. An output signal DCDONE from the flip-flop 22-n in the final stage is supplied to the DC controller 15. As a result, an output signal SDTGO of the DC controller 15 is level "H".

The counter 17 controls its operation by receiving at an enable terminal EN the output signal SDTGO from the DC controller 15. An output signal SAGO from the counter 17 is supplied to the SA controller 16.

An output signal SAEN from the SA controller 16 is supplied to a data input terminal D of the flip-flop 23-0 in the control block 12-0. An output clock signal SACLK from the SA controller 16 is supplied to clock input terminals CK of the flip-flops 23-0, . . . , 23-n in the control blocks 12-0, . . . , 12-n. An output signal from an output terminal Q of the flip-flop 23-0 is supplied to a data input terminal D of the flip-flop 23-1 in the next stage. Likewise, output signals from output terminals Q of the flip-flops 23-1 to 23-(n−1) are supplied to data input terminals D of the flip-flops 23-2 to 23-n in the respective next stages. An output signal SADONE from the flip-flop 23-n in the final stage is supplied to the logic circuits 13.

The multiplexer 18 selects a signal TSDTN[3-0] or TSDTV[3-0] in response to the output signal VERIFY from the logic circuits 13. One signal DSDT[3-0] is supplied to an initialization terminal INI of the counter 17. The multiplexer 19 selects a signal TVREFN[3-0] or TVREFV[3-0] in response to the output signal VERIFY from the logic circuits 13. One signal TVREF[3-0] is supplied to the reference voltage generators 24-0 to 24-n in the control blocks 12-0 to 12-n.

The output signals DC[0], ... , DC[n] from the data output terminals D of the flip-flops 22-0, ... , 22-n in the control blocks 12-0, ... , 12-n are supplied as the reset signals DCp of the memory cells 21-0, ... , 21-n to the memory blocks 11-0, ... , 11-n in the respective corresponding stages. The output signals SAE[0], ... , SAE[n] from the data output terminals D of the flip-flops 23-0, ... , 23-n are supplied as the enable signals SAEn of the sense amplifiers 20-0, ... , 20-n to the memory blocks 11-0, ... , 11-n in the respective corresponding stages. Also, output signals from the data output terminals D of the flip-flops 23-0, ... , 23-n are supplied as operation control signals VREFGO[0], ... , VREFGO[n] to the respective corresponding reference voltage generators 24-0, ... , 24-n. The output reference voltages VREF from the reference voltage generators 24-0, ... , 24-n are supplied to the sense amplifiers 20-0, ... , 20-n in the memory blocks 11-0, ... , 11-n in the respective corresponding stages.

Figure 2:
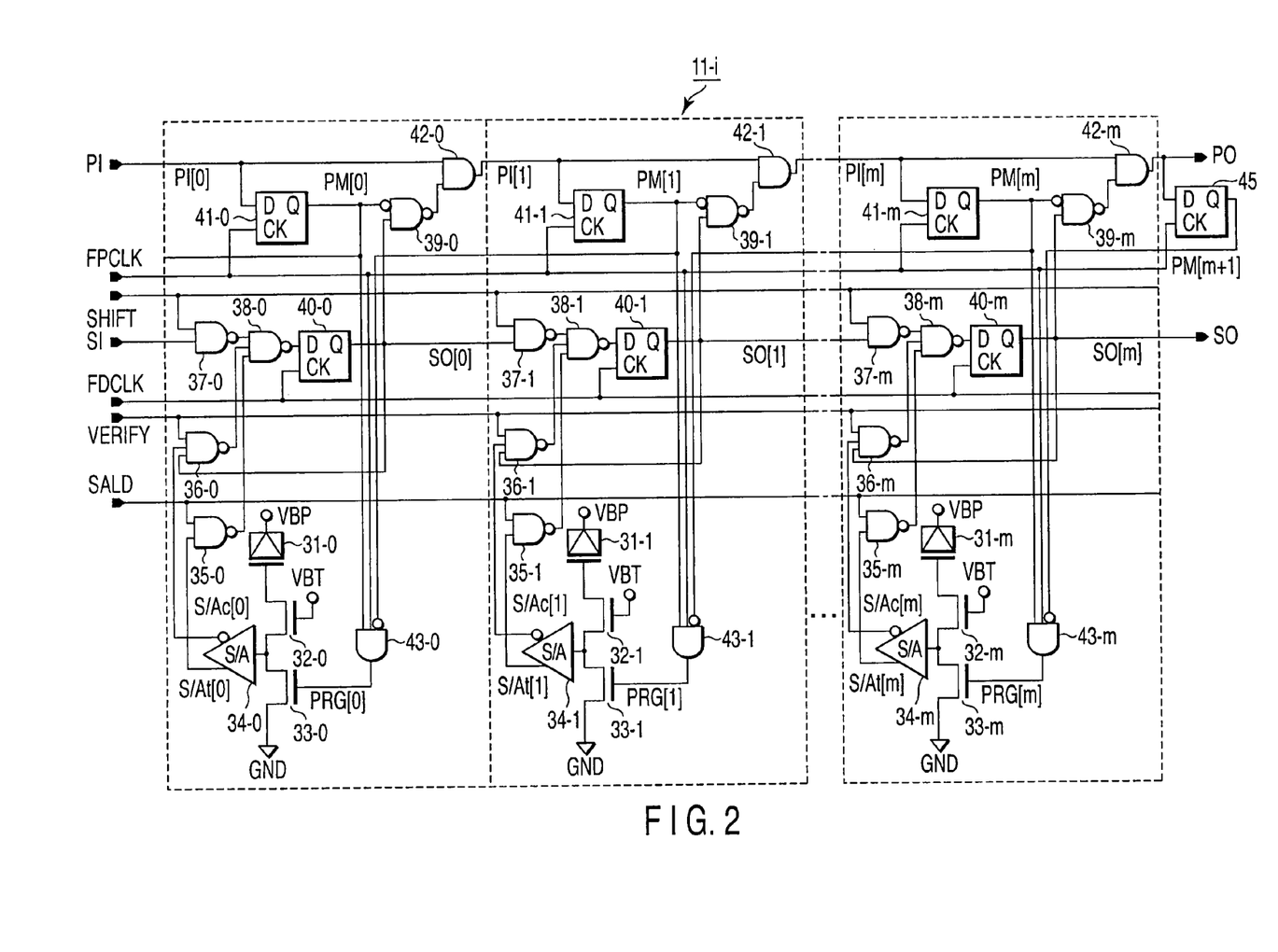
FIG. 2 is a block diagram showing details of the arrangement of a memory block in the circuit shown in FIG. 1.

FIG. 2 is a block diagram showing details of the arrangement of the memory block 11-i (i=0 to n) in the circuit shown in FIG. 1. FIG. 2 shows a circuit for reading out sensed data to the outside, and a circuit for programming data at an electrical fuse, both of which are omitted in FIG. 1. Each circuit surrounded by the broken lines corresponds to one bit, and m+1 circuits are cascaded. Each 1-bit circuit includes a comparator for comparing information to be programmed at an electrical fuse (or information in a fuse data register) with information read out from the electrical fuse (or information sensed and latched in a sense amplifier), and outputting the comparison result indicating pass/fail, the sense amplifier for sensing an irreversible characteristic change of the electrical fuse, a flip-flop for transferring sense amplifier data to the outside, or receiving and storing program data from the outside, a flip-flop for controlling programming, and logic circuit. The memory block 11-i is controlled by an input command to the logic circuits 13.

The memory cell array 11 shown in FIG. 1 is formed by stacking a plurality of circuits (memory blocks) shown in FIG. 2, and connecting output terminals SO and PO in the kth stage to input terminals SI and PI in the (k+1)th stage. Signals except for those supplied to the input terminals SI and PI in the first stage and those supplied from the output terminals SO and PO of each preceding stage are supplied from the logic circuits 13, and a plurality of stages are controlled together.

The 1-bit cell circuit in the first stage of the memory block 11-i includes an electrical fuse 31-0, MOS transistors 32-0 and 33-0, a sense amplifier (S/A) 34-0, NAND gates 35-0, 36-0, 37-0, 38-0, and 39-0, flip-flops 40-0 and 41-0, and AND gates 42-0 and 43-0.

A voltage VBP is applied to one electrode of the electrical fuse 31-0, and the other electrode is connected to one end of a current path of the MOS transistor 32-0. The other end of the current path of the MOS transistor 32-0 is connected to the input terminal of the sense amplifier 34-0 and to one end of a current path of the MOS transistor 33-0. A voltage VBT is applied to the gate of the MOS transistor 32-0. The other end of the current path of the MOS transistor 33-0 is connected to a ground point GND. The gate of the MOS transistor 33-0 is connected to the output terminal of the AND gate 43-0, and a program signal PRG[0] is supplied to this gate.

An output signal SAt[0] from the sense amplifier 34-0 is supplied to one input terminal of the NAND gate 35-0, and an inverted signal SAc[0] from the sense amplifier 34-0 is supplied to the first input terminal of the NAND gate 36-0. A signal SALD is supplied to the other input terminal of the NAND gate 35-0. The signal VERIFY is supplied to the second input terminal of the NAND gate 36-0, and an output signal from the flip-flop 40-0 is supplied to the third input terminal of the NAND gate 36-0. One input terminal of the NAND gate 37-0 is connected to the input terminal SI, and a shift signal SHIFT is supplied to the other input terminal of the NAND gate 37-0.

Output signals from the NAND gates 35-0, 36-0, and 37-0 are supplied to the NAND gate 38-0, and an output signal from the NAND gate 38-0 is supplied to a data input terminal D of the flip-flop 40-0. A clock signal FDCLK is supplied to a clock input terminal CK of the flip-flop 40-0. The flip-flop 40-0 supplies an output signal SO[0] (corresponding to an input signal SI[1] to the next stage) of the corresponding bit to the NAND gate 37-1 in the next stage from an output terminal Q, and also supplies this signal to one input terminal of the NAND gate 39-0.

The input terminal PI is connected to a data input terminal D of the flip-flop 41-0, and a signal FPCLK is supplied to a clock input terminal CK of the flip-flop 41-0. An output signal PM[0] from a data output terminal Q of the flip-flop 41-0 is supplied to the first input terminal of the AND gate 43-0, and an inverted signal of the signal PM[0] is supplied to the other input terminal of the NAND gate 39-0. The signal FPCLK is supplied to the second input terminal of the AND gate 43-0, and an output signal PM[1] from the flip-flop 41-1 in the next stage is supplied to the third input terminal of the AND gate 43-0.

An output signal from the NAND gate 39-0 is supplied to one input terminal of the AND gate 42-0. The input terminal PI is connected to the other input terminal of the AND gate 42-0, and an output signal from the AND gate 42-0 is supplied as an output signal PI[1] of the corresponding bit to a data input terminal D of the flip-flop 41-1 and one input terminal of the AND gate 42-1 in the next stage.

Similar to the first stage, the 1-bit cell circuit in the second stage includes an electrical fuse 31-1, MOS transistors 32-1 and 33-1, a sense amplifier (S/A) 34-1, NAND gates 35-1, 36-1, 37-1, 38-1, and 39-1, flip-flops 40-1 and 41-1, and AND gates 42-1 and 43-0, and has the same circuit configuration as in the first stage.

The 1-bit cell circuit in the mth stage (final stage) also includes an electrical fuse 31-m, MOS transistors 32-m and 33-m, a sense amplifier (S/A) 34-m, NAND gates 35-m, 36-m, 37-m, 38-m, and 39-m, flip-flops 40-m and 41-m, and AND gates 42-m and 43-m, and has the same circuit configuration as above.

A flip-flop 45 is connected to the output side of the cell circuit in the final stage. An output signal from the AND gate 42-m is supplied to a data input terminal D of the flip-flop 45, and the signal FPCLK is supplied to a clock input terminal CK of the flip-flop 45. An output signal PM[m+1] from a data output terminal Q of the flip-flop 45 is inverted and supplied to the third input terminal of the AND gate 43-m.

The output terminal PO connected to the output terminal of the AND gate 42-m and the output terminal SO connected to the output terminal Q of the flip-flop 40-0 output signals to the outside.

The serially connected flip-flops 40-0, . . . , 40-m which operate by the clock signal FDCLK are called fuse data registers. The serially connected flip-flops 41-0, . . . , 41-m which operate by the clock signal FPCLK are called program control registers.

Figure 3A:
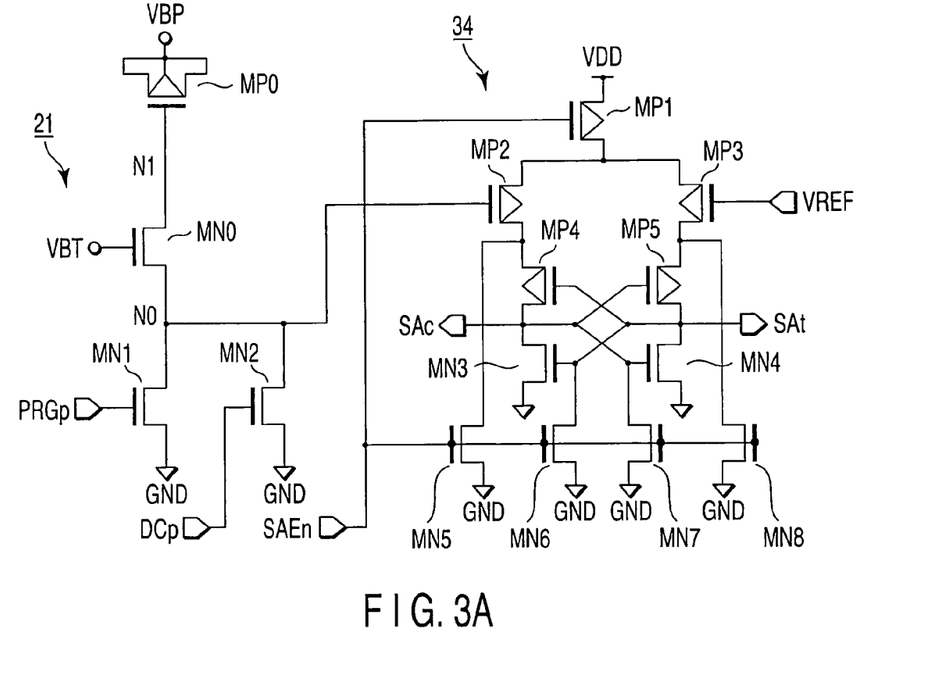
FIGS. 3A and 3B are circuit diagrams showing practical arrangements of an OTP memory cell and sense amplifier shown in FIGS. 1 and 2.

FIGS. 3A and 3B are circuit diagrams showing practical arrangements of the OTP memory cell 21 and sense amplifier 34 shown in FIGS. 1 and 2. Referring to FIG. 3A, each of the gate oxide breakdown type electrical fuses 31-0 to 31-m is formed by a p-channel MOS transistor MP0 with thin gate oxide. The memory cell 21 is made up of the MOS transistor MP0 and n-channel MOS transistors MN0 and MN1 (corresponding to the MOS transistors 32-0 to 32-m and 33-0 to 33-m shown in FIG. 2) with thick gate oxide.

The voltage VBP is applied to the source, drain, and back gate of the MOS transistor MP0, and the gate of the MOS transistor MP0 is connected to the drain (node N1) of the MOS transistor NM0. The voltage VBT is applied to the gate of the MOS transistor MN0, and the source of the MOS transistor MN0 is connected to the drain (node N0) of the MOS transistor MN1. A signal PRGp is supplied to the gate of the MOS transistor MN1, and the source of the MOS transistor MN1 is connected to a ground point GND. By controlling the gate voltage VBT at an appropriate level, the MOS transistor MN0 limits the voltage of the node N0 to "VBT-Vth (the threshold voltage of the MOS transistor MN0)", thereby preventing a high voltage (the program voltage VBP) from being applied to a transistor connected to the node N0.

The sense amplifier 34 is a differential type sense amplifier made up of p-channel MOS transistors MP1 to MP5 and n-channel MOS transistors MN2 to MN8. The sense amplifier 34 compares the voltage at the node N0 of the memory cell 21 with the reference voltage VREF, amplifies the voltage difference, and outputs differential amplified signals SAc and SAt. The drain of the MOS transistor MN2 is connected to the node N0, the source of the MOS transistor MN2 is connected to the ground point GND, and the signal DCp is supplied to the gate of the MOS transistor MN2. The source of the MOS transistor MP1 is connected to a power supply VDD, and the signal SAEn is supplied to the gate of the MOS transistor MP1. The sources of the MOS transistors MP2 and MP3 are connected to the drain of the MOS transistor MP1. The gate of the MOS transistor MP2 is connected to the node N0, and the reference voltage VREF is applied to the gate of the MOS transistor MP3. The sources of the MOS transistors MP4 and MP5 are connected to the drains of the MOS transistors MP2 and MP3, respectively. The drain-to-source path of the MOS transistor MN3 is connected between the drain of the MOS transistor MP4 and the ground point GND, and the drain-to-source path of the MOS transistor MN4 is connected between the drain of the MOS transistor MP5 and the ground point GND. The gates of the MOS transistors MP4 and MN3 are connected to a common drain connecting point of the MOS transistors MP5 and MN4, and this common drain connecting point outputs the signal SAt. The gates of the MOS transistors MP5 and MN4 are connected to a common drain connecting point of the MOS transistors MP4 and MN3, and this common drain connecting point outputs the signal SAc.

Furthermore, the drain of the MOS transistor MN5 is connected to a connecting point of the MOS transistors MP2 and MP4, and the source of the MOS transistor MN5 is connected to the ground point GND. The drain of the MOS transistor MN6 is connected to the gate of the MOS transistor MN3, and the source of the MOS transistor MN6 is connected to the ground point GND. The drain of the MOS transistor MN7 is connected to the gate of the MOS transistor MN4, and the source of the MOS transistor MN7 is connected to the ground point GND. The drain of the MOS transistor MN8 is connected to a connecting point of the MOS transistors MP3 and MP5, and the source of the MOS transistor MN8 is connected to the ground point GND. The signal SAEn is supplied to the gates of the MOS transistors MN5 to MN8 to control their operations.

Figure 3B:
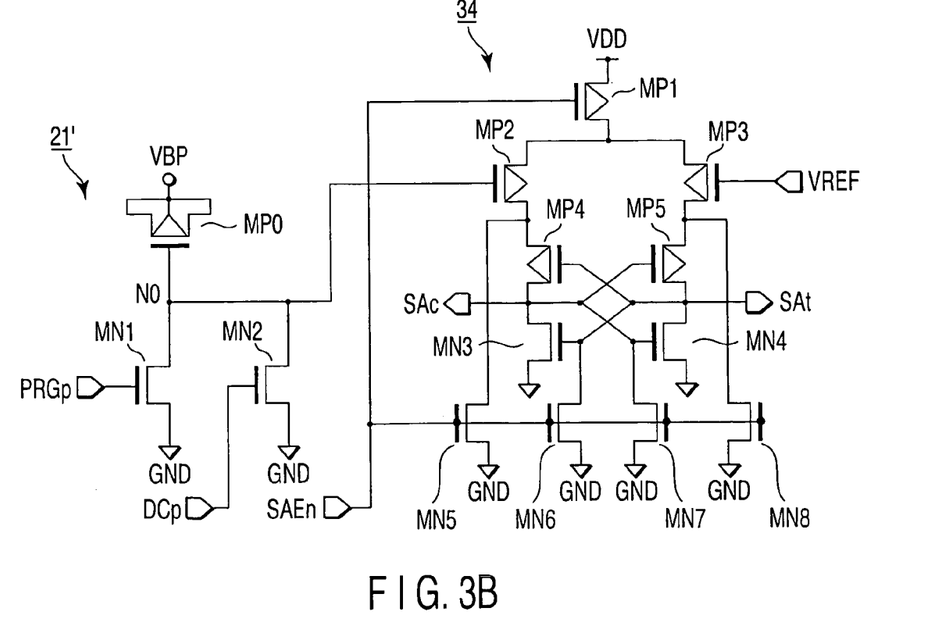

Referring to FIG. 3B, each of the gate oxide breakdown type electrical fuses 31-0 to 31-m is formed by a p-channel MOS transistor MP0 with thin gate oxide. The memory cell 21' is made up of the MOS transistor MP0 and n-channel MOS transistor MN1 of the thick gate type.

The voltage VBP is applied to the source, drain, and back gate of the MOS transistor MP0, and the gate of the MOS transistor MP0 is connected to the drain (node N0) of the MOS transistor MN1. A signal PRGp is supplied to the gate of the MOS transistor MN1, and the source of the MOS transistor MN1 is connected to a ground point GND.

Note that a circuit for controlling the signal PRGp and a circuit for reading out the output signals SAt and SAc also exist, but these circuits are omitted in FIGS. 3A and 3B.

Note also that the signals PRGp and DCp are on a GND level in a default state unless otherwise specified, and the signal SAEn is on a power supply voltage VDD level in a default state unless otherwise specified.

Furthermore, the fabrication process used herein is based on the standard CMOS process, but supports MOS transistors having gate oxides with two or more different thicknesses. That is, the MOS transistor MP0 as an electrical fuse has a thin gate oxide, and the other MOS transistors have thick gate oxides.

To program the electrical fuse MP0, i.e., to breakdown the gate oxide of the MOS transistor MP0 in the above arrangement, the voltage VBP is raised to a sufficiently high level, and the signal PRGp is raised to the level of the power supply voltage VDD, thereby turning on the MOS transistor MN1. Consequently, the nodes N0 and N1 are lowered to the GND level, and the high voltage VBP is applied to the gate oxide of the MOS transistor MP0. This conductive state occurs probably because an electric current concentrates into a narrow breakdown spot immediately after breakdown to generate Joule heat, and this Joule heat irreversibly forms a conductive spot having a relatively low resistance.

To read out data from the electrical fuse MP0, the voltage VBP is set at the level of the power supply voltage VDD, and the voltage VBT is raised to a level higher by the threshold voltage or more than the VDD level in order to prevent a threshold drop of the voltage level at the node N0. The signal DCp is raised to the VDD level to turn on the MOS transistor MN2, and the nodes N0 and N1 are lowered to the GND level. When a predetermined time has elapsed, the signal DCp is dropped to the GND level to turn off the MOS transistor MN2. When the electrical fuse MP0 is programmed, its resistance is low, so the node N0 is charged, and its potential rises with time. In contrast, when the electrical fuse MP0 is not programmed, the node N0 is charged only by a leakage current, so the node N0 is substantially kept at the GND level. After an appropriate SDT, the reference voltage VREF is set at an appropriate intermediate potential between the GND level and the VDD level, thereby lowering the signal SAEn from the VDD level to the GND level. As a result, the sense amplifier 34 amplifies the signal and holds the sensing result. If the level of the node N0 is lower than the reference voltage VREF, the sense amplifier 34 outputs the GND level as the output signal SAt. If the level of the node N0 is higher than the reference voltage VREF, the sense amplifier 34 outputs the VDD level as the output signal SAt.

Figure 4:
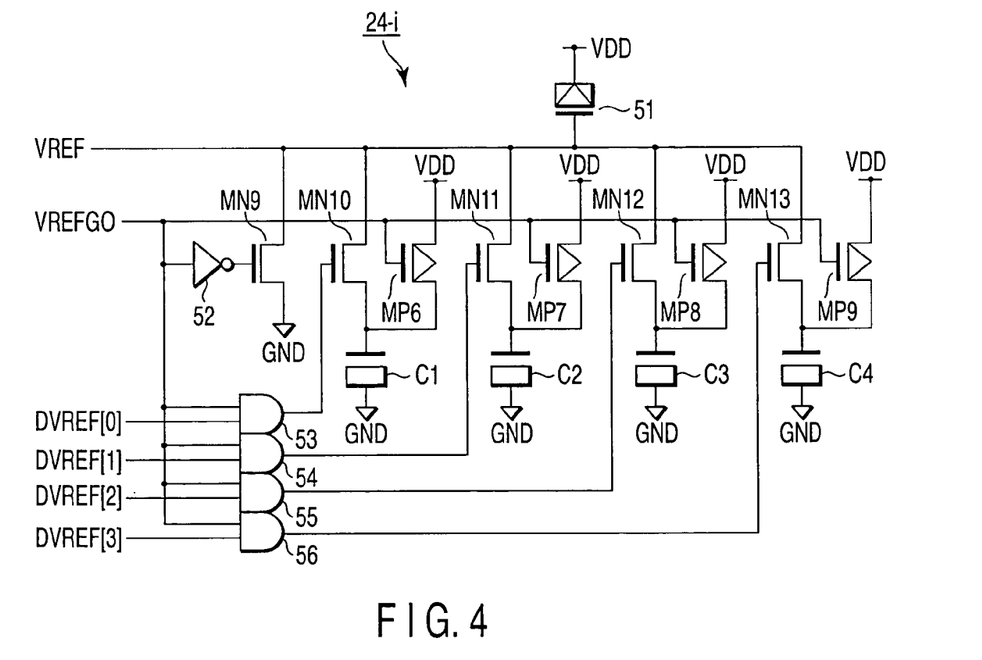
FIG. 4 is a circuit diagram showing a practical arrangement of a reference voltage generator in the circuit shown in FIG. 1.

FIG. 4 is a circuit diagram showing a practical arrangement of the reference voltage generator 24-i (i=0 to n) in the circuit shown in FIG. 1. The reference voltage generator 24-i converts an input digital signal DVREF[3-0] into a corresponding analog voltage VREF by MOS capacitance charge sharing. In this embodiment, the MOS capacitance ratios corresponding to the individual bits of the digital signal DVREF are weighted by the power of 2, i.e., 1:2:4:8, thereby expressing the 16-level reference voltage VREF by a 4-bit digital value.

That is, the reference voltage generator 24-i includes a p-channel MOS capacitor 51, inverter 52, AND gates 53 to 56, p-channel MOS transistors MP6 to MP9, n-channel MOS transistors MN9 to MN13, and MOS capacitors C1 to C4.

One electrode of the MOS capacitor 51 is connected to the power supply VDD, and the other electrode of the MOS capacitor 51 is connected to an output terminal which outputs the reference voltage VREF.

This output terminal for outputting the reference voltage VREF is connected to the drains of the MOS transistors MN9 to MN13. The source of the MOS transistor MN9 is connected to a ground point GND, and the gate of the MOS transistor MN9 is connected to the output terminal of the inverter 52. A signal VREFGO is supplied to the input terminal of the inverter 52. One electrode of each of the MOS capacitors C1 to C4 is connected to the drain of a corresponding one of the MOS transistors MN10 to MN13, and the output terminals of the AND gates 53 to 56 are connected to the gates of the MOS transistors MN10 to MN13. The other electrodes of the MOS capacitors C1 to C4 are connected to the ground point GND. The sources of the MOS transistors MP6 to MP9 are connected to the power supply VDD, and the drain of each of the MOS transistors MP6 to MP9 is connected to one electrode of a corresponding one of the MOS capacitors C1 to C4. The signal VREFGO is supplied to one input terminal of each of the AND gates 53 to 56, and each of digital signals DVREF[0] to DVREF[3] is supplied to the other input terminal of a corresponding one of the AND gates 53 to 56.

Figure 5:
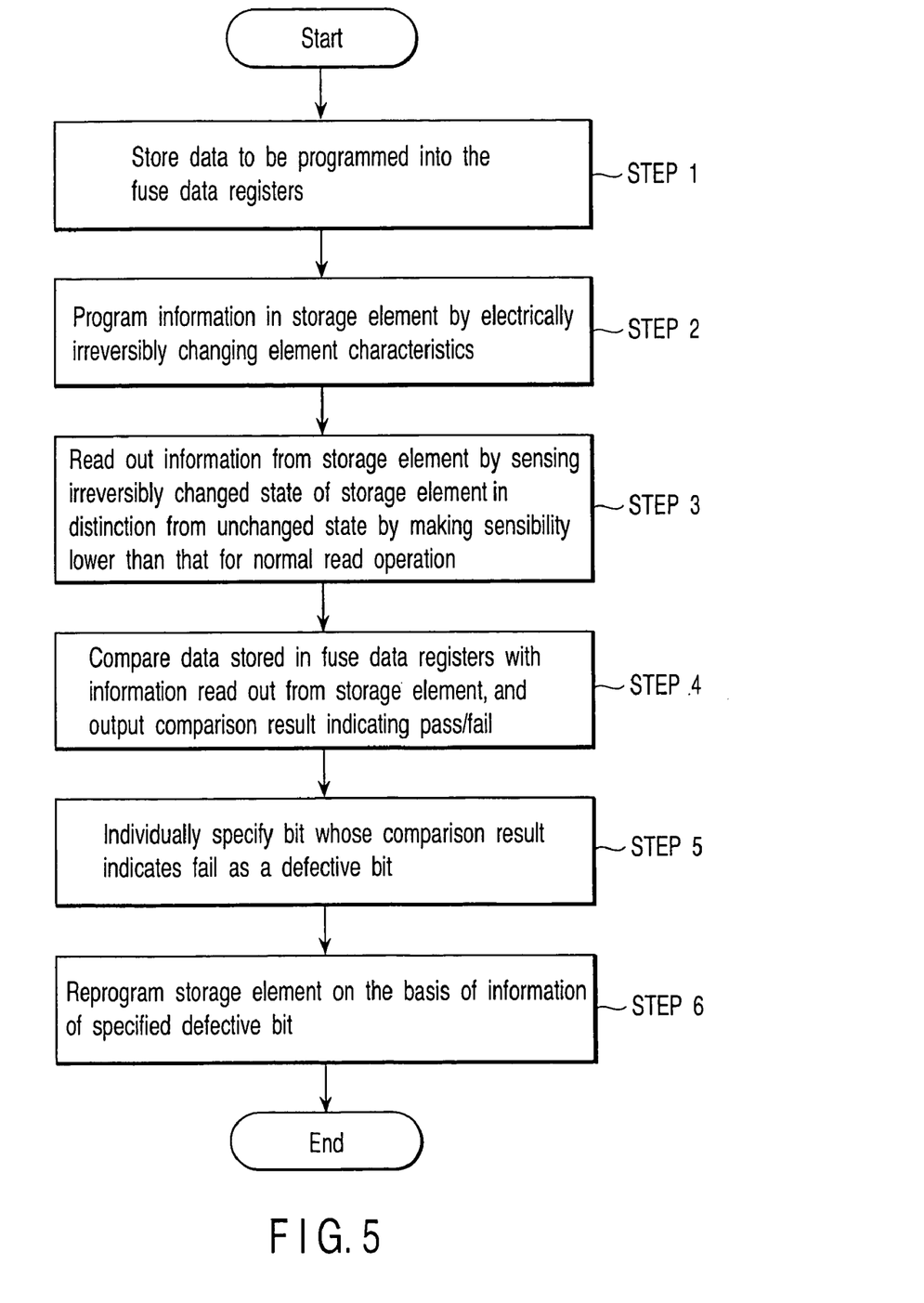
FIG. 5 is a flowchart for explaining an OTP memory programming method according to the embodiment of the present invention.

In the above arrangement, information is programmed in a storage element (OTP memory) as shown in a flowchart of FIG. 5.

First, data to be programmed are stored into the fuse data registers (STEP 1).

Next, information is programmed in a storage element by electrically irreversibly changing the element characteristics (STEP 2).

Then, this irreversibly changed state of the storage element is sensed in distinction from an unchanged state by making the sensibility lower than that for a normal read operation, thereby reading out the information from the storage element (STEP 3)

After that, the data stored in the fuse data registers are compared with the information read out from the storage elements, and the comparison result indicating "pass" or "fail" is output (STEP 4).

Each bit whose comparison result is "fail" is specified as a defective bit (STEP 5), and the storage element is reprogrammed on the basis of information of the thus specified defective bit (STEP 6).

By this programming method, information is read out from a storage element by changing the circuit set value such that the margin is smaller than that in a normal operation, thereby detecting an imperfectly programmed bit or a bit having marginal characteristics. Reprogramming is performed to remedy the detected bit or improve the characteristics of the bit. This realizes a high yield and high reliability.

The operation of a normal sense, read out, and above programming method will be explained in detail below with reference to timing charts in FIGS. 6 to 9 in connection with the circuit configurations shown in FIGS. 1 to 4.

Figure 6:
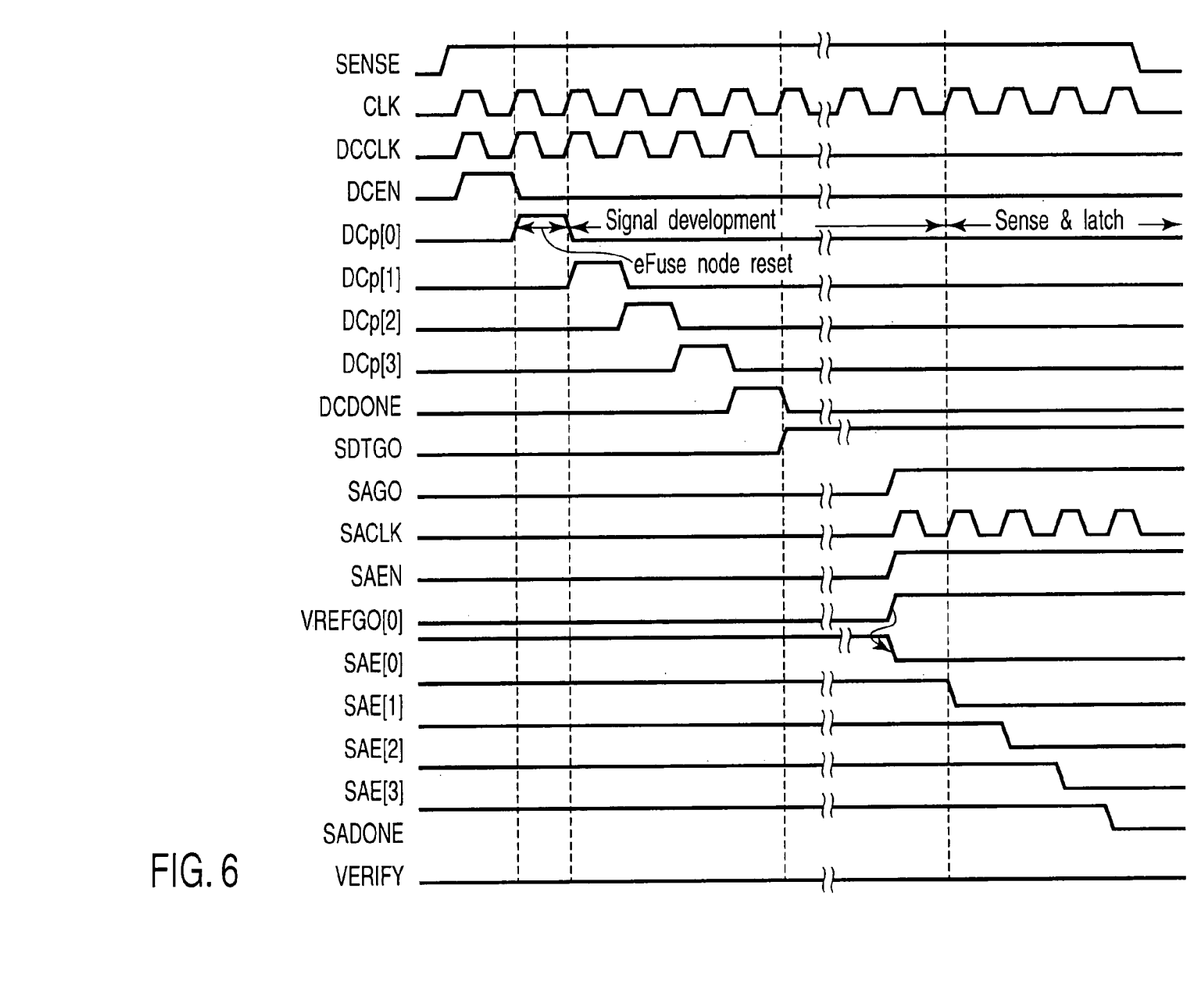
FIG. 6 is a timing chart showing a normal sense operation when four memory blocks are stacked in the circuit shown in FIG. 1.

FIG. 6 is a timing chart showing the normal sense operation (VERIFY=L) when four memory blocks 11-0, . . . , 11-n (n=4) are stacked in the circuit shown in FIG. 1.

When a sense command is input from the outside, the logic circuits (interface logic circuits) 13 issue an internal signal on demand. First, the signal SENSE changes to level "H" to start a sense operation, and the clock generator 14 starts operating. This level "H" of the signal SENSE causes the DC controller 15 to operate. On the basis of the output clock signal CLK from the clock generator 14, the DC controller 15 generates the signal DCCLK, and resets the node N1 of the electrical fuse MP0 in each memory block stage in one cycle. When resets of all the stages are finished (DCDONE=H), the DC controller 15 stops outputting the signal DCCLK, and the signal SDTGO changes to level "H". Since this enables the counter 17, the counter 17 starts counting the clock signals CLK. That is, the counter 17 decrements, for each clock signal CLK, the initial value supplied from the multiplexer 18 to the initialization terminal INI. When the count is 0, the counter 17 outputs the signal SAGO at level "H".

Since VERIFY=0 (level "L") in a normal operation, the multiplexer 18 selects the value of TSDTN[3-0], and a corresponding SDT is set. The SA controller 16 changes the SA enable signal SAEN to level "H" by receiving the level "H" of the signal SAGO, and generates the signal SACLK on the basis of the clock signal CLK. For each cycle of the signal SACLK, the reference voltage VREF is generated and the sense amplifier is activated in each stage.

In the control blocks 12-0, . . . , 12-n, when the output signals VREFGO from the flip-flops 23-0, . . . , 23-n change to level "H", the reference voltage generators 24-0, . . . , 24-n generate the reference voltages VREF. Since VERIFY=0 in a normal operation, the multiplexer 19 selects the signal TVREFN[3-0], and the reference voltage generators 24-0, . . . , 24-n in the individual stages generate the reference voltages VREF corresponding to the set value of the signal TVREFN[3-0]. After the operation is delayed until the level of the reference voltage VREF sufficiently rises by charge sharing, the signal SAE[n] changes from level "H" to level "L". As a consequence, the voltage value of the node N1 of the electrical fuse MP0 is sensed and latched.

When verify is performed, the signal sequence is the same as described above except that VERIFY=H. However, the initial value of the counter 17 is the signal TSDTV[3-0], so the reference voltage generators 24-0, . . . , 24-n generate the reference voltages VREF at a level determined by the signal DVREFV[3-0]. Accordingly, when the signal levels are set such that TSDTN>TSDTV and TVREFN<TVREFV, the sense margin of data "1" can be made smaller by changing the SDT and reference voltage VREF during verify.

Figure 7:
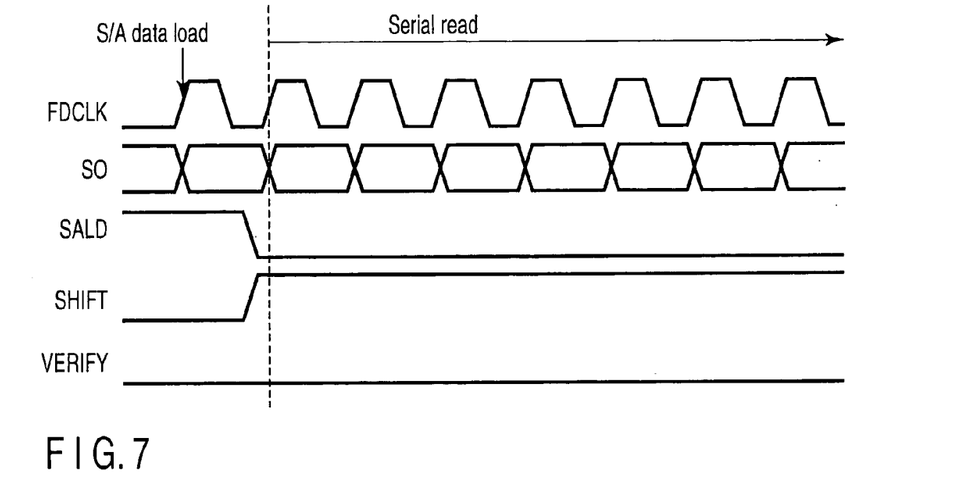
FIG. 7 is a timing chart of signals when stored data of an electrical fuse latched by the sense amplifier shown in FIG. 2 is read out.

FIG. 7 is a timing chart of signals when stored data at the electrical fuses 31-0 to 31-m latched by the sense amplifiers 34-0 to 34-m shown in FIG. 2 is to be read out. First, when the clock signal FDCLK is input while signal SALD=H, signal SHIFT=L, and signal VERIFY=L, outputs from the sense amplifiers 34-0, ..., 34-m are loaded into the fuse data registers (flip-flips 40-0, ..., 40-m). When the clock signal FDCLK is input while signal SHIFT=H, signal SALD=L, and signal VERIFY=L, data can be serially read out from the output terminal SO.

Figure 8:
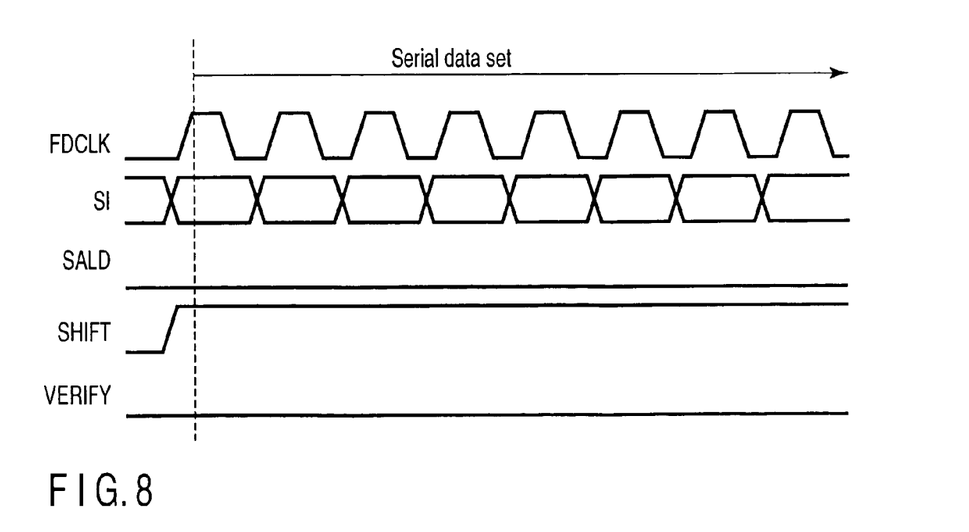
FIG. 8 is a timing chart of signals when the electrical fuse shown in FIG. 2 is programmed.

To program the electrical fuses 31-0 to 31-m, as shown in a timing chart of FIG. 8, data to be programmed is serially input to the fuse data registers (flip-flops 40-0, ..., 40-m) from the input terminal SI by the clock signal FDCLK while SHIFT=H, SALD=L, and VERIFY=L. Subsequently, programming is performed following a procedure as shown in a timing chart of FIG. 9.

Figure 9:
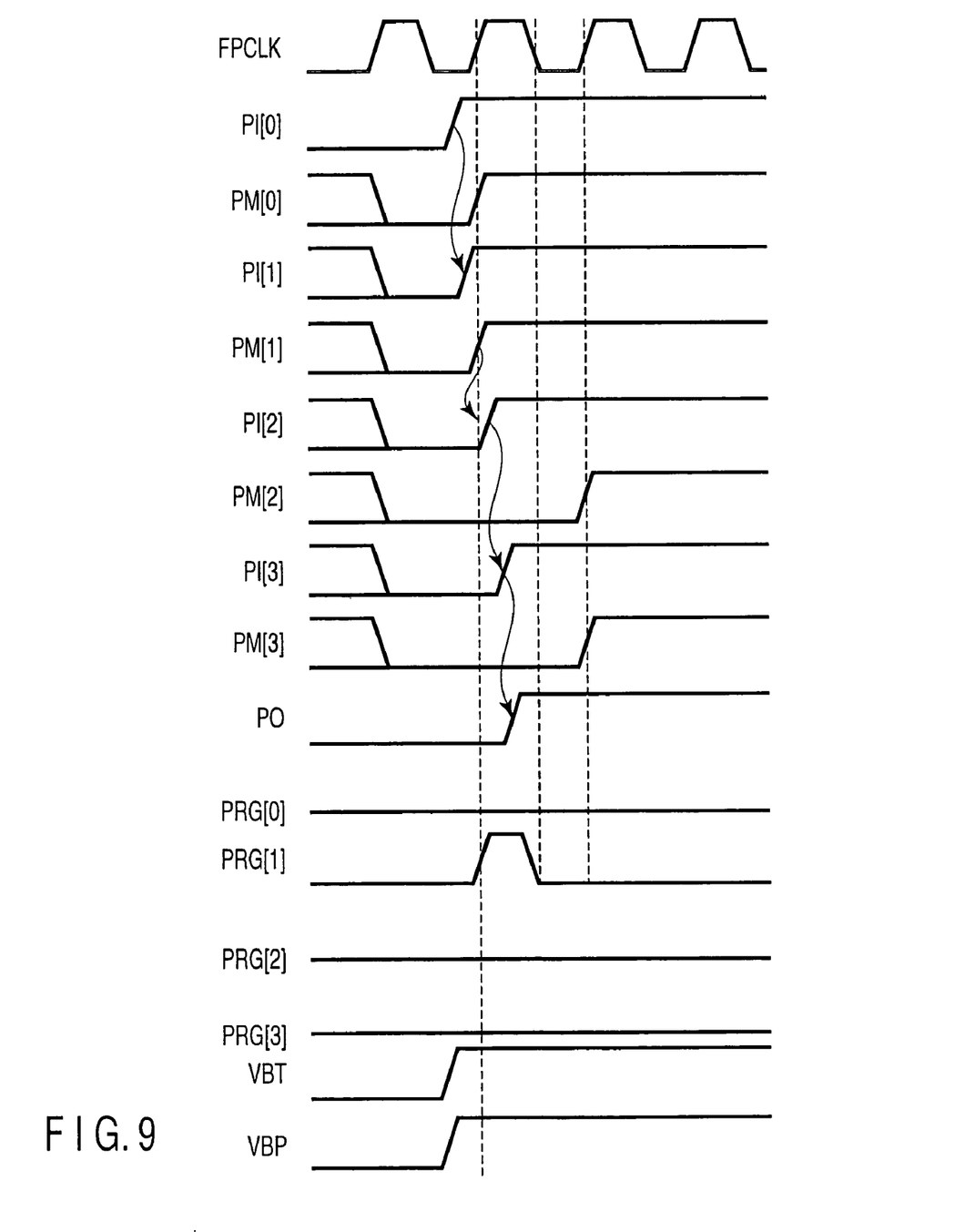
FIG. 9 is a timing chart showing a program operation in the semiconductor integrated circuit device shown in FIGS. 1 to 4.

Assume that "1" is set in the fuse data register 40-1 of bit 1 and "0" is set in all the other bits, and that SO[0]=0, SO[1]=1, and SO[2 to m]=0.

When the input terminal PI is at level "L", output signals PI[1], PI[2], ..., PI[m] from all the AND gates 42-0 to 42-m are at level "L". By inputting the clock signal FPCLK by one cycle while the input terminal PI is set at level "L", therefore, the program control registers (flip-flops 41-0 to 41-m) are initialized, and all output signals PM[0], ..., PM[m+1] from the flip-flops 41-0 to 41-m are set at "0". After raising the level of the voltage VBT and the voltage VBP is raised to a high voltage for programming by enter program command, the input terminal PI is set at level "H", and the clock signal FPCLK is input. Consequently, "1" is set in the fuse data registers, and PM[k]=1 and PM[k+1]=0 hold only for a bit in which SO[k]=1. In this state, the program signal PRG[k] is at level "H" and programming is executed only during a period in which the signal FPCLK is at level "H".

FIG. 9 shows only a 1-bit programming operation. To program a plurality of data "1", only bits in which "1" is set in the fuse data register are programmed one at a time for each clock. A bit in the final stage can also be programmed by the extra 1-bit program control register (flip-flop 45) in the same manner as the other bits.

Since the output terminal PO changes to level "H" while the last data "1" is being programmed, it is possible to detect the end of programming from the outside, and minimize the total programming time. If all the bits of the fuse data registers are "0", the output terminal PO changes to level "H", without receiving the clock signal FPCLK, when the input terminal PI is set at level "H".

The programmed data is sensed by setting the voltage VBP at a potential for sensing. If VERIFY=H in this sensing, an imperfectly programmed bit having marginal characteristics as mentioned earlier is sensed as "0". Assume that bit 1 is imperfectly programmed, and SAt[1]=0 (SAc[1]=1). When the clock signal FDCLK is input while VERIFY=H, "1" is set in the corresponding fuse data register because SI[1] (SO[0])=1 and SAc[1]=1. In bit k in which "0" is stored, SI[k] (SO[k−1])=0 and SAc[1]=1, so "0" is stored in the fuse data register. Also, in bit k which is not defective and in which "1" is stored, SI[k]=1 and SAc[k]=0. Since SI[k]=1 and SAc[k]=0, therefore, "0" is set in the corresponding fuse data register. That is, by loading the calculation result of the values of the sense amplifier and fuse data register, "1" is reset only in a bit of the fuse data register in which data "1" is imperfectly programmed.

Accordingly, if even only one defective bit is present, the output terminal PO holds level "µL" even when the input terminal PI is set at level "H". If there is no defective bit, the output terminal PO changes to level "H", without receiving the clock signal FPCLK, when the input terminal PI is set at level "H". Therefore, pass/fail of programming can be determined only by checking one bit of the output terminal PO. If an imperfectly programmed bit is present, this imperfectly programmed bit alone can be reprogrammed and remedied simply by executing the program operation in this state. In this embodiment as described above, it is possible to efficiently execute verify, pass/fail determination, and reprogramming of an electrical fuse.

In the arrangement as described above, therefore, the irreversibly changed state of a storage element is sensed in distinction from an unchanged state by making the sensibility lower than that for a normal read operation. In other words, information is read out while the margin for distinctively sensing the programmed state is made low. Consequently, the programmed state can be verified with a sufficient margin.

Also, the circuit includes a sensing circuit for sensing pass/fail and a circuit for specifying a defective bit. Therefore, defective bits can be efficiently remedied.

Accordingly, this embodiment can realize a semiconductor integrated circuit device including a semiconductor one-time programmable memory having a high yield, high reliability, and high testing efficiency, and a method of programming the device.

Note that the above embodiment is explained by taking as an example a Gate-Ox electrical fuse which programs data by conducts a MOS transistor by breaking down a gate insulator of the transistor. However, an electrical fuse is not limited to this Gate-Ox electrical fuse. For example, an electrical fuse may also be a polysilicon fuse which programs data by cut or blow a polysilicon wire for gate conductor.

As described above, according to one aspect of this invention, it is possible to obtain a semiconductor integrated circuit device capable of increasing the yield and reliability by making the sensibility lower than that for a normal read operation of an OTP memory using an electrical fuse, and by remedying a sensed defective bit by reprogramming it, and a method of programming the device.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor integrated circuit device comprising:
   a storage element in which information is programmed by electrically irreversibly changing an element characteristic;
   a state sensing circuit configured to sense the irreversibly changed state of the storage element in distinction from an unchanged state;
   a control circuit configured to change sensibility of the state sensing circuit;
   a fuse register configured to store data to be programmed in the storage element; and a comparator configured to compare information in the fuse data register with information read out from the storage element by the state sensing circuit, to individually specify a bit whose comparison result indicates fail as a defective bit, and to output a comparison result indicating pass/fail, and in which the storage element is reprogrammed on the basis of information of a defective bit specified by the comparator.

2. A device according to claim 1, wherein the state sensing circuit senses the state of the storage element by converting a resistance of the storage element into a voltage at a corresponding level, and comparing the converted voltage with a reference voltage.

3. A device according to claim 2, wherein the control circuit changes the sensibility of the state sensing circuit by changing the reference voltage.

4. A device according to claim 2, wherein the control circuit changes the sensibility of the state sensing circuit by changing a time during which a capacitor is charged or discharged by an electric current flowing through the storage element.

5. A device according to claim 1, wherein the control circuit causes the state sensing circuit to make a margin for verify sense smaller than that for normal sense in the state sensing circuit.

6. A semiconductor integrated circuit device comprising:
a memory cell array including a plurality of memory blocks, each memory block including a storage element in which information is programmed by electrically irreversibly changing an element characteristic, and a state sensing circuit configured to sense the irreversibly changed state of the storage element in distinction from an unchanged state;
a first control circuit including a plurality of control blocks formed in one-to-one correspondence with said plurality of memory blocks, each control block controlling an operation of the storage element in a corresponding memory block, and changing ability of the state sensing circuit to detecting an imperfectly programmed bit; and
a second control circuit configured to generate a signal for controlling an operation of the first control circuit on the basis of an input command.

7. A device according to claim 6, wherein each memory block further comprises a fuse data register which loads data to be programmed in the storage element and one output signal from the state sensing circuit, and a program control register which loads data for controlling programming of the storage element.

8. A device according to claim 7, wherein the fuse data register includes flip-flops, and the program control register includes flip-flops.

9. A device according to claim 6, wherein the storage element is an electrical fuse to one electrode of which a program voltage is applied, and
which further comprises a first n-channel MOS transistor having a current path one end of which is connected to the other electrode of the electrical fuse, and having a gate to which a voltage for controlling a voltage of the other end of the current path is applied, and a second n-channel MOS transistor having a current path one end of which is connected to the other end of the current path of the first n-channel MOS transistor, and the other end of which is connected to a ground point, and having a gate to which a program signal for programming the electrical fuse is supplied.

10. A device according to claim 9, wherein the electrical fuse is a p-channel MOS transistor of a thin gate oxide type having a source, a drain, and a back gate of which a program voltage is applied, and the first n-channel MOS transistor and second n-channel MOS transistor are a thick gate oxide type.

11. A device according to claim 6, wherein the storage element is an electrical fuse to one electrode of which a program voltage is applied, and
which further comprises an n-channel MOS transistor having a current path one end of which is connected to the other electrode of the electrical fuse, and the other end of which is connected to a ground point, and having a gate to which a program signal for programming the electrical fuse is supplied.

12. A device according to claim 11, wherein the electrical fuse is a p-channel MOS transistor of a thin gate oxide type having a source, a drain, and a back gate of which a program voltage is applied, and the n-channel MOS transistor is a thick gate oxide type.

13. A device according to claim 6, wherein the state sensing circuit includes a differential sense amplifier which converts a resistance of the storage element into a voltage at a corresponding level, and compares the converted voltage with a reference voltage.

14. A device according to claim 13, wherein the sense amplifier has a first input terminal to which a voltage at a connecting point of the first and second MOS transistors is supplied, and a second input terminal to which an output reference voltage from a reference voltage generator is supplied, compares the converted voltage with the reference voltage, amplifies the voltage difference, and outputs a differential amplified signal.

15. A device according to claim 6, wherein each control block in the first control circuit includes a first flip-flop which outputs a reset signal for reading out data from an electrical fuse of a corresponding memory block, a second flip-flop which outputs an enable signal of the sense amplifier, a delay circuit which delays the output signal from the second flip-flop and supplies the delayed signal to the sense amplifier, and a reference voltage generator which is controlled by the output signal from the second flip-flop to supply a reference voltage to the sense amplifier.

16. A device according to claim 15, wherein the reference voltage generator converts an input digital signal into a corresponding analog voltage by MOS capacitance charge sharing.

17. A device according to claim 15, wherein the second control circuit includes a logic circuit which receives a command, a clock generator which generates a clock signal in response to an output signal indicating a sense operation from the logic circuit, a first controller which controls an operation of the first flip-flop on the basis of the output signal indicating a sense operation from the logic circuit and the clock signal supplied from the clock generator, a counter which counts the clock signals supplied from the clock generator in response to an output signal from the first controller, a second controller which controls an operation of the second flip-flop on the basis of a count of the counter and the clock signal supplied from the clock generator, a first multiplexer which is controlled by an output signal indicating a verify operation from the logic circuit, and gives an initial value to the counter, and a second multiplexer which is controlled by the output signal indicating a verify operation from the logic circuit, and gives a digital signal for setting the reference voltage to the reference voltage generator.

18. A method of progranming a semiconductor integrated circuit device in which information is read out from a storage element by sensing an irreversibly changed state of the storage element in distinction from an unchanged state during a normal read operation, comprising:

storing data to be programmed into a fuse data register;

programming information in the storage element by electrically irreversibly changing an element characteristic;

reading out information from the storage element by sensing the irreversibly changed state of the storage element in distinction from an unchanged state by making sensibility lower than that for a normal read operation;

comparing the information in the fuse data register with the information read out from the storage element, and outputting a comparison result indicating pass/fail;

individually specifying a bit whose comparison result indicates fail as a defective bit; and reprogramming the storage element on the basis of information of the specified defective bit.

19. A method according to claim 18, further comprising resetting a storage node of the storage element before information is programmed in the storage element.

20. A method according to claim 18, wherein reading out information from the storage element is to sense a bit having a marginal characteristic as a defective bit.

21. A method according to claim 18, wherein reading out information from the storage element is executed by changing sensibility of a state sensing circuit by changing a reference voltage of the state sensing circuit.

22. A method according to claim 18, wherein reading out information from the storage element is executed by changing sensibility of a state sensing circuit by changing a time during which a capacitor is charged or discharged by an electric current flowing through the storage element.

23. A semiconductor integrated circuit device comprising:

a storage element in which information is programmed by electrically irreversibly changing an element characteristic;

a state sensing circuit configured to sense the irreversibly changed state of the storage element in distinction from an unchanged state; and a control circuit configured to change sensibility of the state sensing circuit, wherein the control circuit causes the state sensing circuit to make a margin for verify sense smaller than that for normal sense in the state sensing circuit.

* * * * *